(12) United States Patent
Kim et al.

(10) Patent No.: US 10,861,512 B2
(45) Date of Patent: *Dec. 8, 2020

(54) SEMICONDUCTOR DEVICES

(71) Applicant: SK hynix Inc., Icheon-si (KR)

(72) Inventors: Woongrae Kim, Icheon-si (KR); Tae Yong Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 26 days.

This patent is subject to a terminal disclaimer.

(21) Appl. No.: 16/160,760

(22) Filed: Oct. 15, 2018

(65) Prior Publication Data
US 2019/0325929 A1 Oct. 24, 2019

(30) Foreign Application Priority Data

Apr. 23, 2018 (KR) .................. 10-2018-0047009

(51) Int. Cl.
| | |
|---|---|
| *G11C 7/12* | (2006.01) |
| *G11C 8/12* | (2006.01) |
| *G11C 7/10* | (2006.01) |
| *G11C 8/10* | (2006.01) |
| *G11C 11/419* | (2006.01) |
| *G11C 11/4093* | (2006.01) |
| *G11C 11/4094* | (2006.01) |
| *G11C 11/4096* | (2006.01) |
| *G11C 11/418* | (2006.01) |
| *G11C 11/408* | (2006.01) |

(52) U.S. Cl.
CPC .............. *G11C 7/12* (2013.01); *G11C 7/109* (2013.01); *G11C 7/1063* (2013.01); *G11C 8/10* (2013.01); *G11C 8/12* (2013.01); *G11C 11/4087* (2013.01); *G11C 11/4093* (2013.01); *G11C 11/4094* (2013.01); *G11C 11/4096* (2013.01); *G11C 11/418* (2013.01); *G11C 11/419* (2013.01)

(58) Field of Classification Search
None
See application file for complete search history.

(56) References Cited

U.S. PATENT DOCUMENTS

| 6,091,640 A * | 7/2000 | Kawahara ............ G11C 7/1045 |
| | | 365/185.28 |
| 8,325,537 B2 | 12/2012 | Shimizu et al. |
| 10,593,386 B2 * | 3/2020 | Kim ..................... G11C 7/1069 |

(Continued)

FOREIGN PATENT DOCUMENTS

| KR | 1020100128638 A | 12/2010 |
| KR | 1020160096934 A | 8/2016 |

*Primary Examiner* — Muna A Techane
(74) *Attorney, Agent, or Firm* — William Park & Associates Ltd.

(57) ABSTRACT

A semiconductor device includes a column operation control circuit and a bank column address generation circuit. The column operation control circuit generates first and second bank address control signals as well as first and second bank control pulses from first and second bank selection signals in response to a synthesis control pulse such that data in a first bank and data in a second bank are simultaneously outputted in a first mode. The bank column address generation circuit generates first and second bank column addresses for selecting the first and second banks from a column address in response to the first and second bank address control signals.

15 Claims, 14 Drawing Sheets

(56) References Cited

U.S. PATENT DOCUMENTS

| | | | |
|---|---|---|---|
| 2004/0004900 A1* | 1/2004 | Dosaka | G11C 11/4082 365/230.06 |
| 2015/0310904 A1 | 10/2015 | Kim et al. | |
| 2019/0325929 A1 | 10/2019 | Kim et al. | |

* cited by examiner

FIG.2

| OPERATION | ICLK EDGE | CA<1> | CA<2> | CA<3> | CA<4> |
|---|---|---|---|---|---|
| WRITE | rising | L | H | H | × (A) |
| | falling | IBA<1> | IBA<2> | IBA<3> | IBA<4> |
| READ | rising | H | L | × | × (B) |
| | falling | IBA<1> | IBA<2> | IBA<3> | IBA<4> |

SEMICONDUCTOR DEVICES

CROSS-REFERENCE TO RELATED APPLICATIONS

The present application claims priority under 35 U.S.C § 119(a) to Korean Application No. 10-2018-0047009, filed on Apr. 23, 2018, which is incorporated herein by reference in its entirety.

BACKGROUND

1. Technical Field

Embodiments of the present disclosure relate to semiconductor devices performing column operations.

2. Related Art

In general, semiconductor devices, such as dynamic random access memory (DRAM) devices, may include a plurality of bank groups having cell arrays which are selected by address. Each of the bank groups may be realized to include a plurality of banks. A semiconductor device may perform a column operation that selects any one of the plurality of bank groups and outputs data stored in the cell array included in the selected bank group through input/output (I/O) lines.

SUMMARY

In accordance with an embodiment of the present teachings, a semiconductor device includes a column operation control circuit and a bank column address generation circuit. The column operation control circuit is configured to generate first and second bank address control signals as well as first and second bank control pulses from first and second bank selection signals in response to a synthesis control pulse such that data in a first bank and data in a second bank are simultaneously outputted in a first mode. The bank column address generation circuit is configured to generate first and second bank column addresses for selecting the first and second banks from a column address in response to the first and second bank address control signals.

In accordance with another embodiment of the present teachings, a semiconductor device includes a column operation control circuit and a bank column address generation circuit. The column operation control circuit is configured to generate a first bank address control signal and a bank control pulse from a first bank selection signal in response to a synthesis control pulse such that data are inputted into a second bank after data are inputted into a first bank. The column operation control circuit is also configured to generate a second bank address control signal and an internal bank control pulse from a second bank selection signal in response to an internal synthesis control pulse. The bank column address generation circuit is configured to generate first and second bank column addresses for selecting the first and second banks from a column address in response to the first and second bank address control signals.

In accordance with an additional embodiment of the present teachings, a semiconductor device includes a synthesis control pulse generation circuit and a column operation control circuit. The synthesis control pulse generation circuit is configured to generate a synthesis control pulse in synchronization with a read command pulse, wherein the read command pulse is created by decoding an external control signal to activate a first mode. The synthesis control pulse generation circuit is further configured to generate the synthesis control pulse and an internal synthesis control pulse in synchronization with a write command pulse, wherein the write command pulse is created by decoding the external control signal to activate a second mode. The column operation control circuit is configured to generate first and second bank address control signals as well as first and second bank control pulses from first and second bank selection signals in response to the synthesis control pulse such that data in a first bank and data in a second bank are simultaneously outputted in the first mode.

BRIEF DESCRIPTION OF THE DRAWINGS

FIG. 2 shows a table illustrating various logic level combinations of an external control signal, used in the semiconductor device of FIG. 1, for generating a command pulse and an address.

DETAILED DESCRIPTION OF THE EMBODIMENTS

Various embodiments of the present disclosure are described hereinafter with reference to the accompanying drawings. The embodiments described herein are for illustrative purposes only and are not intended to limit the scope of the present disclosure.

Figure 1:
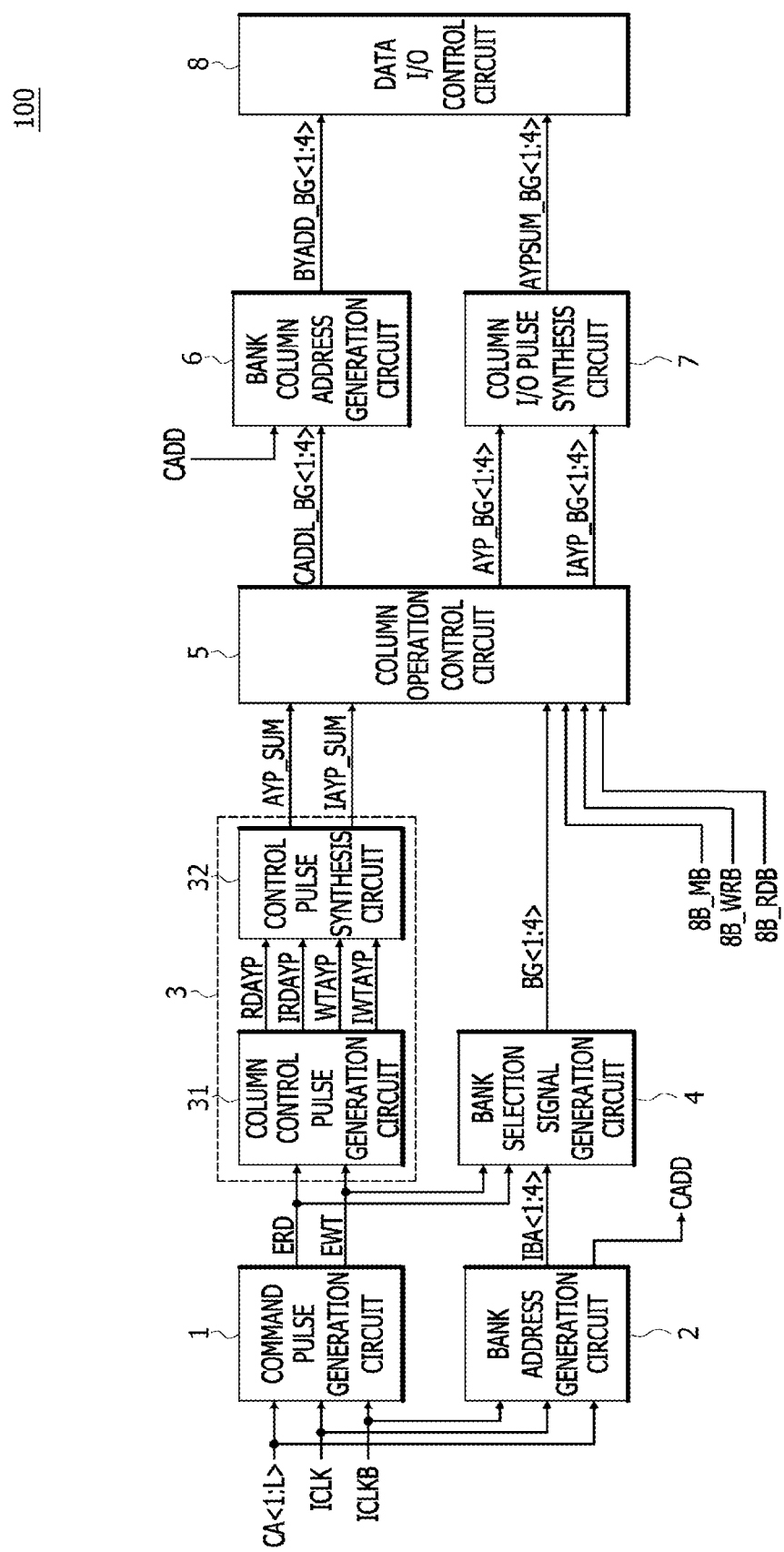
FIG. 1 shows a block diagram illustrating a configuration of a semiconductor device, according to an embodiment of the present disclosure.

As illustrated in FIG. 1, a semiconductor device 100 according to an embodiment may include a command pulse generation circuit 1, a bank address generation circuit 2, a synthesis control pulse generation circuit 3, a bank selection signal generation circuit 4, a column operation control circuit 5, a bank column address generation circuit 6, a column input/output (I/O) pulse synthesis circuit 7, and a data I/O control circuit 8.

The command pulse generation circuit 1 may generate a read command pulse ERD and a write command pulse EWT in response to first to $L^{th}$ external control signals CA<1:L>, an internal clock signal ICLK, and an inverted internal clock signal ICLKB. The first to $L^{th}$ external control signals CA<1:L> may include a command and an address that are provided by an external device. The internal clock signal ICLK may be toggled in synchronization with a rising edge of a clock signal (not shown) that is provided by the external device or another external device. The inverted internal clock signal ICLKB may be toggled in synchronization with a falling edge of the clock signal (not shown). The number 'L' of bits included in the first to $L^{th}$ external control signals CA<1:L> may be different in different embodiments.

The command pulse generation circuit 1 may decode the first to $L^{th}$ external control signals CA<1:L> in synchronization with the internal clock signal ICLK or the inverted internal clock signal ICLKB to generate the read command pulse ERD for execution of a read operation. In an embodiment, the command pulse generation circuit 1 decodes the first to $L^{th}$ external control signals CA<1:L> in synchronization with the internal clock signal ICLK to generate the read command pulse ERD for performing the read operation. A point in time when the read command pulse ERD is generated for the read operation may be determined as the point in time when the first to $L^{th}$ external control signals CA<1:L> having a first predetermined logic level combination is inputted to the command pulse generation circuit 1 in synchronization with a rising edge of the internal clock signal ICLK. In some other embodiments, the read command pulse ERD may be generated in synchronization with the inverted internal clock signal ICLKB.

The command pulse generation circuit 1 may decode the first to $L^{th}$ external control signals CA<1:L> in synchronization with the internal clock signal ICLK or the inverted internal clock signal ICLKB to generate the write command pulse EWT for execution of a write operation. In an embodiment, the command pulse generation circuit 1 decodes the first to $L^{th}$ external control signals CA<1:L> in synchronization with the internal clock signal ICLK to generate the write command pulse EWT for performing the write operation. A point in time when the write command pulse EWT is generated for the write operation may be determined as the point in time when the first to $L^{th}$ external control signals CA<1:L> having a second predetermined logic level combination is inputted to the command pulse generation circuit 1 in synchronization with a rising edge of the internal clock signal ICLK. In some other embodiments, the write command pulse EWT may be generated in synchronization with the inverted internal clock signal ICLKB.

The bank address generation circuit 2 may generate first to fourth bank addresses IBA<1:4> and a column address CADD in response to the first to $L^{th}$ external control signals CA<1:L>, the internal clock signal ICLK, and the inverted internal clock signal ICLKB. The bank address generation circuit 2 may decode the first to $L^{th}$ external control signals CA<1:L> in synchronization with the internal clock signal ICLK or the inverted internal clock signal ICLKB to generate the first to fourth bank addresses IBA<1:4> and the column address CADD. A logic level combination of the first to fourth bank addresses IBA<1:4> may be determined as a logic level combination of some signals among the first to $L^{th}$ external control signals CA<1:L> that are inputted to the bank address generation circuit 2 in synchronization with a rising edge of the internal clock signal ICLK or a rising edge of the inverted internal clock signal ICLKB. A logic level combination of bits included in the column address CADD may be determined as a logic level combination of some other signals among the first to $L^{th}$ external control signals CA<1:L> that are inputted to the bank address generation circuit 2 in synchronization with a rising edge of the internal clock signal ICLK or a rising edge of the inverted internal clock signal ICLKB. The number of bits included in the column address CADD may be different in different embodiments.

The synthesis control pulse generation circuit 3 may generate a synthesis control pulse AYP_SUM and an internal synthesis control pulse IAYP_SUM in response to the read command pulse ERD and the write command pulse EWT. The synthesis control pulse generation circuit 3 may generate the synthesis control pulse AYP_SUM and the internal synthesis control pulse IAYP_SUM if the read command pulse ERD or the write command pulse EWT occurs. The synthesis control pulse generation circuit 3 may include a column control pulse generation circuit 31 and a control pulse synthesis circuit 32.

The column control pulse generation circuit 31 may generate a read column control pulse RDAYP, an internal read column control pulse IRDAYP, a write column control pulse WTAYP, and an internal write column control pulse IWTAYP in response to the read command pulse ERD and the write command pulse EWT.

The column control pulse generation circuit 31 may generate the read column control pulse RDAYP and the internal read column control pulse IRDAYP in response to the read command pulse ERD. The column control pulse generation circuit 31 may sequentially generate the read column control pulse RDAYP and the internal read column control pulse IRDAYP after a first predetermined period of time (also referred to simply as "a period") elapses from a point in time when the read command pulse ERD is created. The column control pulse generation circuit 31 may shift the read command pulse ERD by the first predetermined period to generate the read column control pulse RDAYP. The first predetermined period by which the read command pulse ERD is shifted may be set according to a read latency. The first predetermined period by which the read command pulse ERD is shifted may be different in different embodiments. The column control pulse generation circuit 31 may shift the read column control pulse RDAYP by a second predetermined period to generate the internal read column control pulse IRDAYP. The second predetermined period by which the read column control pulse RDAYP is shifted may be a period which is set to perform a column operation according to a burst length. The second predetermined period by which the read column control pulse RDAYP is shifted may be different in different embodiments.

The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The column control pulse generation circuit 31 may generate the write column control pulse WTAYP and the internal write column control pulse IWTAYP in response to the write command pulse EWT. The column control pulse generation circuit 31 may sequentially generate the write column control pulse WTAYP and the internal write column control pulse IWTAYP after a third predetermined period elapses from a point in time when the write command pulse EWT is created. The column control pulse generation circuit 31 may shift the write command pulse EWT by the third predetermined period to generate the write column control pulse WTAYP. The third predetermined period by which the write command pulse EWT is shifted may be set according to a write latency. The third predetermined period by which the write command pulse EWT is shifted may be different in different embodiments. The column control pulse generation circuit 31 may shift the write column control pulse WTAYP by a fourth predetermined period to generate the internal write column control pulse IWTAYP. The fourth predetermined period by which the write column control pulse WTAYP is shifted may be a period which is set to perform the column operation according to the burst length. The fourth predetermined period by which the write column control pulse WTAYP is shifted may be different in different embodiments.

The control pulse synthesis circuit 32 may generate the synthesis control pulse AYP_SUM and the internal synthesis control pulse IAYP_SUM in response to the read column control pulse RDAYP, the internal read column control pulse IRDAYP, the write column control pulse WTAYP, and the internal write column control pulse IWTAYP. The control pulse synthesis circuit 32 may generate the synthesis control pulse AYP_SUM if the read column control pulse RDAYP or the write column control pulse WTAYP is created. The control pulse synthesis circuit 32 may generate the internal synthesis control pulse IAYP_SUM if the internal read column control pulse IRDAYP or the internal write column control pulse IWTAYP is created.

The bank selection signal generation circuit 4 may generate first to fourth bank selection signals BG<1:4> from the first to fourth bank addresses IBA<1:4> in response to the read command pulse ERD and the write command pulse EWT. The bank selection signal generation circuit 4 may decode the first to fourth bank addresses IBA<1:4> to generate the first to fourth bank selection signals BG<1:4>, if the read command pulse ERD or the write command pulse EWT is created. A signal enabled among the first to fourth bank selection signals BG<1:4> for each of various logic level combinations of the first to fourth bank addresses IBA<1:4> may be different in different embodiments.

The column operation control circuit 5 may generate first to fourth bank address control signals CADDL_BG<1:4>, first to fourth bank control pulses AYP_BG<1:4>, and first to fourth internal bank control pulses IAYP_BG<1:4> in response to the synthesis control pulse AYP_SUM, the internal synthesis control pulse IAYP_SUM, the first to fourth bank selection signals BG<1:4>, a mode signal 8B_MB, a mode write signal 8B_WRB, and a mode read signal 8B_RDB. The mode signal 8B_MB may be enabled to have a logic "low" level in an eight-bank mode. A four-bank mode, the eight-bank mode, and a sixteen-bank mode may be provided by the double data rate (e.g., 5th generation DDR5) memory devices. The four-bank mode may be referred to as a bank group mode. Bank groups may include a plurality of banks. For example, each of the bank groups may include four banks. In the four-bank mode, the column operation of one bank included in one bank group may be performed by one command. In the eight-bank mode, the column operations of two banks, which are respectively included in two separate bank groups, may be sequentially performed by one command. In the sixteen-bank mode, the column operations of four banks, which are respectively included in four separate bank groups, may be sequentially performed by one command. The eight-bank mode may include an eight-bank read mode and an eight-bank write mode. The mode write signal 8B_WRB may be enabled to have a logic "low" level in the eight-bank write mode so that data are inputted to two banks included in two separate bank groups by one write command. The mode read signal 8B_RDB may be enabled to have a logic "low" level in the eight-bank read mode so that data stored in two banks included in two separate bank groups are outputted by one read command. Logic levels of the mode signal 8B_MB, the mode write signal 8B_WRB, and the mode read signal 8B_RDB, when enabled, may be different in different embodiments.

The column operation control circuit 5 may latch the first to fourth bank selection signals BG<1:4> in synchronization with the synthesis control pulse AYP_SUM to generate the first to fourth bank address control signals CADDL_BG<1:4> and the first to fourth bank control pulses AYP_BG<1:4>, if the semiconductor device 100 is out of the eight-bank mode. The column operation control circuit 5 may latch the first to fourth bank selection signals BG<1:4> in synchronization with the internal synthesis control pulse IAYP_SUM to generate the first to fourth internal bank control pulses IAYP_BG<1:4>, if the semiconductor device 100 is out of the eight-bank mode.

The column operation control circuit 5 may latch the first to fourth bank selection signals BG<1:4> in synchronization with the synthesis control pulse AYP_SUM to generate the first to fourth bank address control signals CADDL_BG<1:4> and the first to fourth bank control pulses AYP_BG<1:4>, if the semiconductor device 100 is in the eight-bank read mode.

The column operation control circuit 5 may latch the first and second bank selection signals BG<1:2> in synchronization with the synthesis control pulse AYP_SUM to generate the first and second bank address control signals CADDL_BG<1:2> and the first and second bank control pulses AYP_BG<1:2>, in the eight-bank write mode. Signals latched by the column operation control circuit 5 synchronized with the synthesis control pulse AYP_SUM in the eight-bank write mode may be selected from the first to fourth bank selection signals BG<1:4> to be different according to embodiment. The column operation control circuit 5 may latch the third and fourth bank selection signals BG<3:4> in synchronization with the internal synthesis control pulse IAYP_SUM to generate the third and fourth internal bank control pulses IAYP_BG<3:4>, in the eight-bank write mode. Signals latched by the column operation control circuit 5 synchronized with the internal synthesis control pulse IAYP_SUM in the eight-bank write mode may be selected from the first to fourth bank selection signals BG<1:4> to be different according to embodiment.

The bank column address generation circuit 6 may generate first to fourth bank column addresses BYADD_BG<1:4> from the column address CADD in response to the first to fourth bank address control signals CADDL_BG<1:4>. The bank column address generation circuit 6 may latch the column address CADD to output the latched column address as the first bank column address BYADD_BG<1> if the first bank address control signal CADDL_BG<1> is enabled. The first bank address control signal CADDL_BG<1> may be enabled to have a logic "high" level or a logic "low" level according to embodiment. The first bank column address BYADD_BG<1> may include the same bits as the column address CADD. The bank column address generation circuit 6 may latch the column address CADD to output the latched column address as the second bank column address BYADD_BG<2> if the second bank address control signal CADDL_BG<2> is enabled. The second bank address control signal CADDL_BG<2> may be enabled to have a logic "high" level or a logic "low" level according to embodiment. The second bank column address BYADD_BG<2> may include the same bits as the column address CADD. The bank column address generation circuit 6 may latch the column address CADD to output the latched column address as the third bank column address BYADD_BG<3> if the third bank address control signal CADDL_BG<3> is enabled. The third bank address control signal CADDL_BG<3> may be enabled to have a logic "high" level or a logic "low" level according to embodiment. The third bank column address BYADD_BG<3> may include the same bits as the column address CADD. The bank column address generation circuit 6 may latch the column address CADD to output the latched column address as the fourth bank column address BYADD_BG<4> if the fourth bank address control signal CADDL_BG<4> is enabled. The fourth bank address control signal CADDL_BG<4> may be enabled to have a logic "high" level or a logic "low" level according to embodiment. The fourth bank column address BYADD_BG<4> may include the same bits as the column address CADD.

The column I/O pulse synthesis circuit 7 may generate first to fourth bank synthesis control pulses AYPSUM_BG<1:4> in response to the first to fourth bank control pulses AYP_BG<1:4> and the first to fourth internal bank control pulses IAYP_BG<1:4>. The column I/O pulse synthesis circuit 7 may generate the first bank synthesis control pulse AYPSUM_BG<1> if the first bank control pulse AYP_BG<1> or the first internal bank control pulse IAYP_BG<1> is created. The column I/O pulse synthesis circuit 7 may generate the second bank synthesis control pulse AYPSUM_BG<2> if the second bank control pulse AYP_BG<2> or the second internal bank control pulse IAYP_BG<2> is created. The column I/O pulse synthesis circuit 7 may generate the third bank synthesis control pulse AYPSUM_BG<3> if the third bank control pulse AYP_BG<3> or the third internal bank control pulse IAYP_BG<3> is created. The column I/O pulse synthesis circuit 7 may generate the fourth bank synthesis control pulse AYPSUM_BG<4> if the fourth bank control pulse AYP_BG<4> or the fourth internal bank control pulse IAYP_BG<4> is created.

The data I/O control circuit 8 may control a data I/O operation of the semiconductor device 100 in response to the first to fourth bank column addresses BYADD_BG<1:4> and the first to fourth bank synthesis control pulses AYPSUM_BG<1:4>. The data I/O control circuit 8 may perform the column operation of a bank selected by the first bank column address BYADD_BG<1> if the first bank synthesis control pulse AYPSUM_BG<1> is created. For example, if first to fourth bank groups are included in the semiconductor device 100 and a bank included in the first bank group is selected by the first bank column address BYADD_BG<1>, the same number of data as bits set according to the burst length may be sequentially inputted to or outputted from the selected bank included in the first bank group. The data I/O control circuit 8 may perform the column operation of a bank selected by the second bank column address BYADD_BG<2> if the second bank synthesis control pulse AYPSUM_BG<2> is created. For example, if first to fourth bank groups are included in the semiconductor device 100 and a bank included in the second bank group is selected by the second bank column address BYADD_BG<2>, the same number of data as bits set according to the burst length may be sequentially inputted to or outputted from the selected bank included in the second bank group. The data I/O control circuit 8 may perform the column operation of a bank selected by the third bank column address BYADD_BG<3> if the third bank synthesis control pulse AYPSUM_BG<3> is created. For example, if first to fourth bank groups are included in the semiconductor device 100 and a bank included in the third bank group is selected by the third bank column address BYADD_BG<3>, the same number of data as bits set according to the burst length may be sequentially inputted to or outputted from the selected bank included in the third bank group. The data I/O control circuit 8 may perform the column operation of a bank selected by the fourth bank column address BYADD_BG<4> if the fourth bank synthesis control pulse AYPSUM_BG<4> is created. For example, if first to fourth bank groups are included in the semiconductor device 100 and a bank included in the fourth bank group is selected by the fourth bank column address BYADD_BG<4>, the same number of data as bits set according to the burst length may be sequentially inputted to or outputted from the selected bank included in the fourth bank group.

Referring to FIG. 2, a command pulse and an address generated according to a logic level combination of the first to fourth external control signals CA<1:4> are listed. If the first to fourth external control signals CA<1:4> are set to have a logic level combination of 'A' in synchronization with a rising edge of the internal clock signal ICLK, then a command pulse for performing the write operation may be generated. For the first to fourth external control signals CA<1:4>, the logic level combination of 'A' means that the first external control signal CA<1> has a logic "low(L)" level and the second and third external control signals CA<2:3> have a logic "high(H)" level. In such a case, the fourth external control signal CA<4> may be irrelevant, as indicated in FIG. 2 by the fourth external control signal CA<4> being crossed out. After the command pulse for the write operation is generated, the first to fourth external control signals CA<1:4> inputted to the semiconductor device 100 in synchronization with a falling edge of the internal clock signal ICLK may be generated as the first to fourth bank addresses IBA<1:4> for the write operation.

If the first to fourth external control signals CA<1:4> are set to have a logic level combination of 'B' in synchronization with a rising edge of the internal clock signal ICLK, then a command pulse for performing the read operation may be generated. In the first to fourth external control signals CA<1:4>, the logic level combination of 'B' means that the first external control signal CA<1> has a logic "high(H)" level and the second external control signal CA<2> has a logic "low(L)" level. In such a case, the third and fourth external control signals CA<3:4> may be irrelevant, as indicated in FIG. 2 by the third and fourth external control signals CA<3:4> being crossed out. After the command pulse for the read operation is generated, the first to fourth external control signals CA<1:4> inputted to the semiconductor device 100 in synchronization with a falling edge of the internal clock signal ICLK may be generated as the first to fourth bank addresses IBA<1:4> for the read operation.

Figure 3:
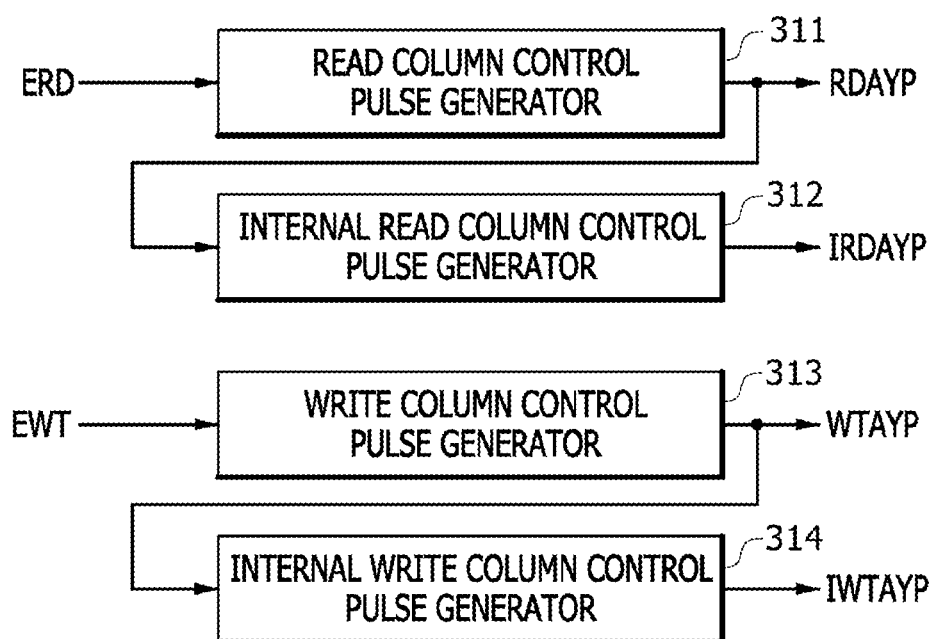
FIG. 3 shows a block diagram illustrating a configuration of the column control pulse generation circuit included in the semiconductor device of FIG. 1.

Referring to FIG. 3, the column control pulse generation circuit 31 may include a read column control pulse generator 311, an internal read column control pulse generator 312, a write column control pulse generator 313, and an internal write column control pulse generator 314.

The read column control pulse generator 311 may shift the read command pulse ERD by the first predetermined period to generate the read column control pulse RDAYP. The read column control pulse generator 311 may be configured to shift the read command pulse ERD by the first predetermined period which is set according to the read latency. The internal read column control pulse generator 312 may shift the read column control pulse RDAYP by the second predetermined period to generate the internal read column control pulse IRDAYP. The internal read column control pulse generator 312 may be configured to shift the read column control pulse RDAYP by the second predetermined period which is set to perform the column operation according to the burst length during the read operation.

The write column control pulse generator 313 may shift the write command pulse EWT by the third predetermined period to generate the write column control pulse WTAYP. The write column control pulse generator 313 may be configured to shift the write command pulse EWT by the third predetermined period which is set according to the write latency. The internal write column control pulse generator 314 may shift the write column control pulse WTAYP by the fourth predetermined period to generate the internal write column control pulse IWTAYP. The internal write column control pulse generator 314 may be configured to shift the write column control pulse WTAYP by the fourth predetermined period which is set to perform the column operation according to the burst length during the write operation. The read column control pulse generator 311, the internal read column control pulse generator 312, the write column control pulse generator 313, and the internal write column control pulse generator 314 may be realized using shift registers or delay circuits according to embodiment.

Figure 4:
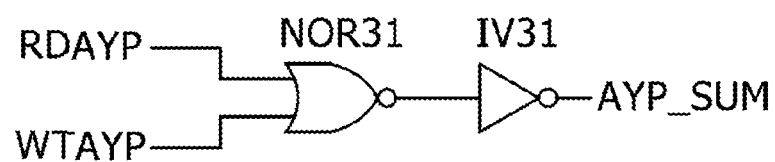
FIG. 4 shows a circuit diagram illustrating the control pulse synthesis circuit included in the semiconductor device of FIG. 1.
Figure 4:
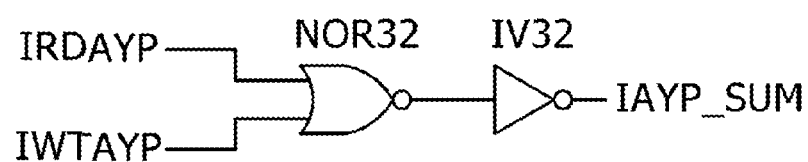

Referring to FIG. 4, the control pulse synthesis circuit 32 may include NOR gates NOR31 and NOR32 and inverters IV31 and IV32. The NOR gate NOR31 and the inverter IV31 may perform a logical OR operation of the read column control pulse RDAYP and the write column control pulse WTAYP to generate the synthesis control pulse AYP_SUM. The synthesis control pulse AYP_SUM may be generated if the read column control pulse RDAYP or the write column control pulse WTAYP is created. The NOR gate NOR32 and the inverter IV32 may perform a logical OR operation of the internal read column control pulse IRDAYP and the internal write column control pulse IWTAYP to generate the internal synthesis control pulse IAYP_SUM. The internal synthesis control pulse IAYP_SUM may be generated if the internal read column control pulse IRDAYP or the internal write column control pulse IWTAYP is created.

Figure 5:
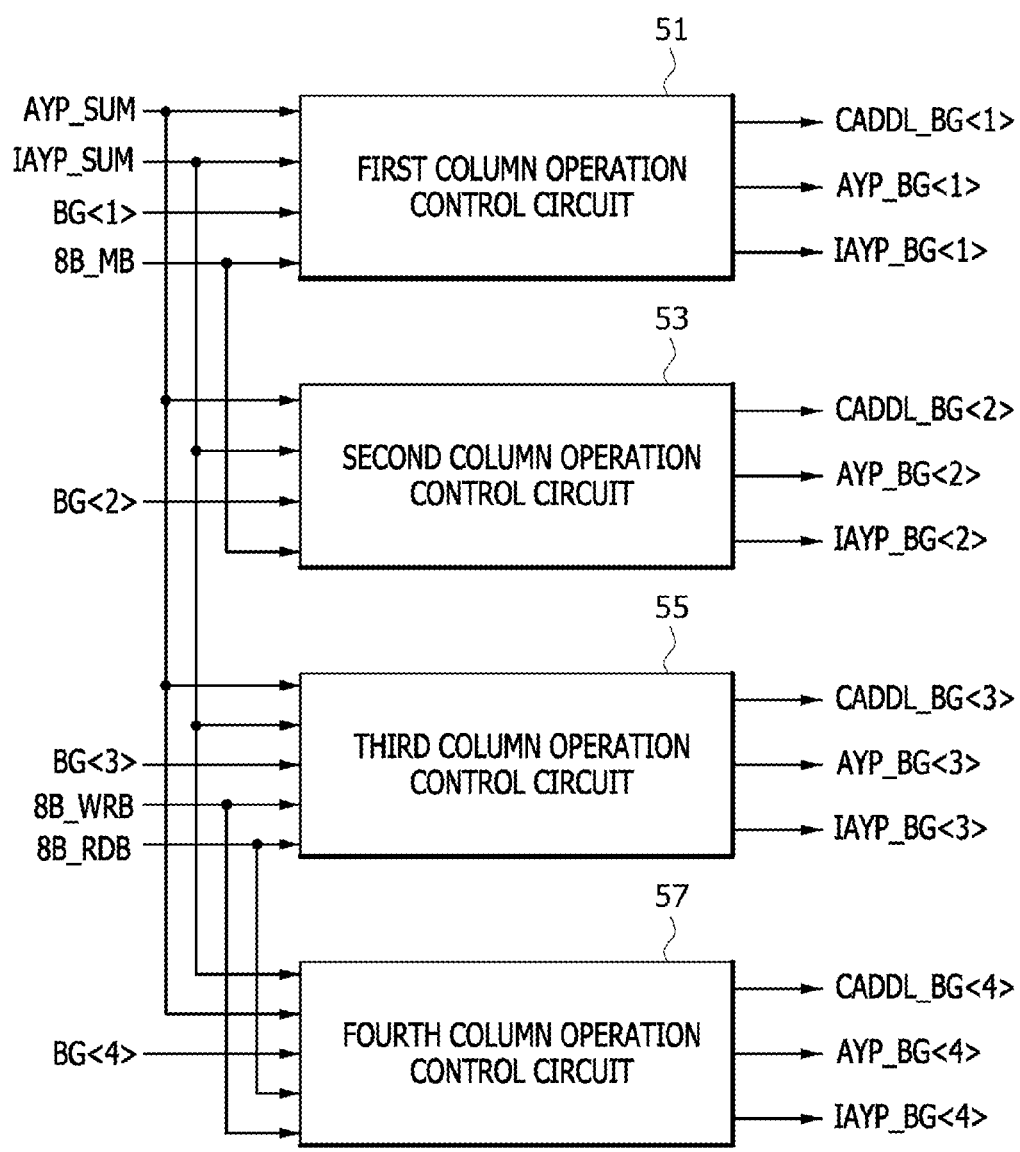
FIG. 5 shows a block diagram illustrating a configuration of the column operation control circuit included in the semiconductor device of FIG. 1.

Referring to FIG. 5, the column operation control circuit 5 may include a first column operation control circuit 51, a second column operation control circuit 53, a third column operation control circuit 55, and a fourth column operation control circuit 57.

The first column operation control circuit 51 may generate the first bank address control signal CADDL_BG<1>, the first bank control pulse AYP_BG<1>, and the first internal bank control pulse IAYP_BG<1> in response to the synthesis control pulse AYP_SUM, the internal synthesis control pulse IAYP_SUM, the first bank selection signal BG<1>, and the mode signal 8B_MB. The first column operation control circuit 51 may generate the first bank address control signal CADDL_BG<1> and the first bank control pulse AYP_BG<1> from the first bank selection signal BG<1>, which is latched in synchronization with the synthesis control pulse AYP_SUM. The first column operation control circuit 51 may receive the mode signal 8B_MB, which is disabled if the semiconductor device 100 is out of the eight-bank mode, and may generate the first internal bank control pulse IAYP_BG<1> from the first bank selection signal BG<1>, which is latched in synchronization with the internal synthesis control pulse IAYP_SUM. The first column operation control circuit 51 may receive the mode signal 8B_MB, which is enabled in the eight-bank mode, and may interrupt the creation of the first internal bank control pulse IAYP_BG<1>.

The second column operation control circuit 53 may generate the second bank address control signal CADDL_BG<2>, the second bank control pulse AYP_BG<2>, and the second internal bank control pulse IAYP_BG<2> in response to the synthesis control pulse AYP_SUM, the internal synthesis control pulse IAYP_SUM, the second bank selection signal BG<2>, and the mode signal 8B_MB. The second column operation control circuit 53 may generate the second bank address control signal CADDL_BG<2> and the second bank control pulse AYP_BG<2> from the second bank selection signal BG<2>, which is latched in synchronization with the synthesis control pulse AYP_SUM. The second column operation control circuit 53 may receive the mode signal 8B_MB, which is disabled if the semiconductor device 100 is out of the eight-bank mode, and may generate the second internal bank control pulse IAYP_BG<2> from the second bank selection signal BG<2>, which is latched in synchronization with the internal synthesis control pulse IAYP_SUM. The second column operation control circuit 53 may receive the mode signal 8B_MB, which is enabled in the eight-bank mode, and may interrupt the creation of the second internal bank control pulse IAYP_BG<2>.

The third column operation control circuit 55 may generate the third bank address control signal CADDL_BG<3>, the third bank control pulse AYP_BG<3>, and the third internal bank control pulse IAYP_BG<3> in response to the synthesis control pulse AYP_SUM, the internal synthesis control pulse IAYP_SUM, the third bank selection signal BG<3>, the mode write signal 8B_WRB, and the mode read signal 8B_RDB.

The third column operation control circuit 55 may receive the mode write signal 8B_WRB, which is disabled if the semiconductor device 100 is out of the eight-bank write mode, and may generate the third bank control pulse AYP_BG<3> from the third bank selection signal BG<3>, which is latched in synchronization with the synthesis control pulse AYP_SUM. The third column operation control circuit 55 may receive the mode write signal 8B_WRB, which is enabled in the eight-bank write mode, and may interrupt the creation of the third bank control pulse AYP_BG<3>.

The third column operation control circuit 55 may receive the mode read signal 8B_RDB, which is disabled if the semiconductor device 100 is out of the eight-bank read mode, and may generate the third internal bank control pulse IAYP_BG<3> from the third bank selection signal BG<3>, which is latched in synchronization with the internal synthesis control pulse IAYP_SUM. The third column operation control circuit 55 may receive the mode read signal 8B_RDB, which is enabled in the eight-bank read mode, and may interrupt the creation of the third internal bank control pulse IAYP_BG<3>.

The third column operation control circuit 55 may receive the mode signal 8B_MB, which is disabled if the semiconductor device 100 is out of the eight-bank write mode and the eight-bank read mode, and may generate the third bank address control signal CADDL_BG<3> from the third bank selection signal BG<3>, which is latched in synchronization with the synthesis control pulse AYP_SUM. The third column operation control circuit 55 may receive the mode read signal 8B_RDB, which is enabled in the eight-bank read mode, and may generate the third bank address control signal CADDL_BG<3> from the third bank selection signal BG<3>, which is latched in synchronization with the synthesis control pulse AYP_SUM. The third column operation control circuit 55 may receive the mode write signal 8B_WRB, which is enabled in the eight-bank write mode, and may generate the third bank address control signal CADDL_BG<3> from the third bank selection signal BG<3>, which is latched in synchronization with the internal synthesis control pulse IAYP_SUM.

The fourth column operation control circuit 55 may generate the fourth bank address control signal CADDL_BG<4>, the fourth bank control pulse AYP_BG<4>, and the fourth internal bank control pulse IAYP_BG<4> in response to the synthesis control pulse AYP_SUM, the internal synthesis control pulse IAYP_SUM, the fourth bank selection signal BG<4>, the mode write signal 8B_WRB, and the mode read signal 8B_RDB.

The fourth column operation control circuit 57 may receive the mode write signal 8B_WRB, which is disabled if the semiconductor device 100 is out of the eight-bank write mode, and may generate the fourth bank control pulse AYP_BG<4> from the fourth bank selection signal BG<4>, which is latched in synchronization with the synthesis control pulse AYP_SUM. The fourth column operation control circuit 57 may receive the mode write signal 8B_WRB, which is enabled in the eight-bank write mode, and may interrupt the creation of the fourth bank control pulse AYP_BG<4>.

The fourth column operation control circuit 57 may receive the mode read signal 8B_RDB, which is disabled if the semiconductor device 100 is out of the eight-bank read mode, and may generate the fourth internal bank control pulse IAYP_BG<4> from the fourth bank selection signal BG<4>, which is latched in synchronization with the internal synthesis control pulse IAYP_SUM. The fourth column operation control circuit 57 may receive the mode read signal 8B_RDB, which is enabled in the eight-bank read mode, and may interrupt the creation of the fourth internal bank control pulse IAYP_BG<4>.

The fourth column operation control circuit 57 may receive the mode signal 8B_MB, which is disabled if the semiconductor device 100 is out of the eight-bank write mode and the eight-bank read mode, and may generate the fourth bank address control signal CADDL_BG<4> from the fourth bank selection signal BG<4>, which is latched in synchronization with the synthesis control pulse AYP_SUM. The fourth column operation control circuit 57 may receive the mode read signal 8B_RDB, which is enabled in the eight-bank read mode, and may generate the fourth bank address control signal CADDL_BG<4> from the fourth bank selection signal BG<4>, which is latched in synchronization with the synthesis control pulse AYP_SUM. The fourth column operation control circuit 57 may receive the mode write signal 8B_WRB, which is enabled in the eight-bank write mode, and may generate the fourth bank address control signal CADDL_BG<4> from the fourth bank selection signal BG<4>, which is latched in synchronization with the internal synthesis control pulse IAYP_SUM.

Figure 6:
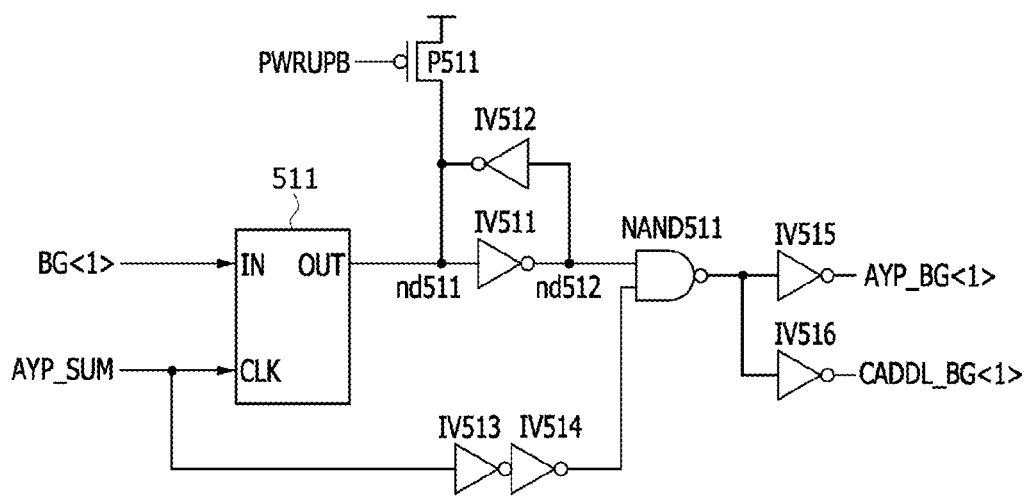
FIG. 6 shows a circuit diagram illustrating the first column operation control circuit included in the column operation control circuit of FIG. 5.
Figure 6:
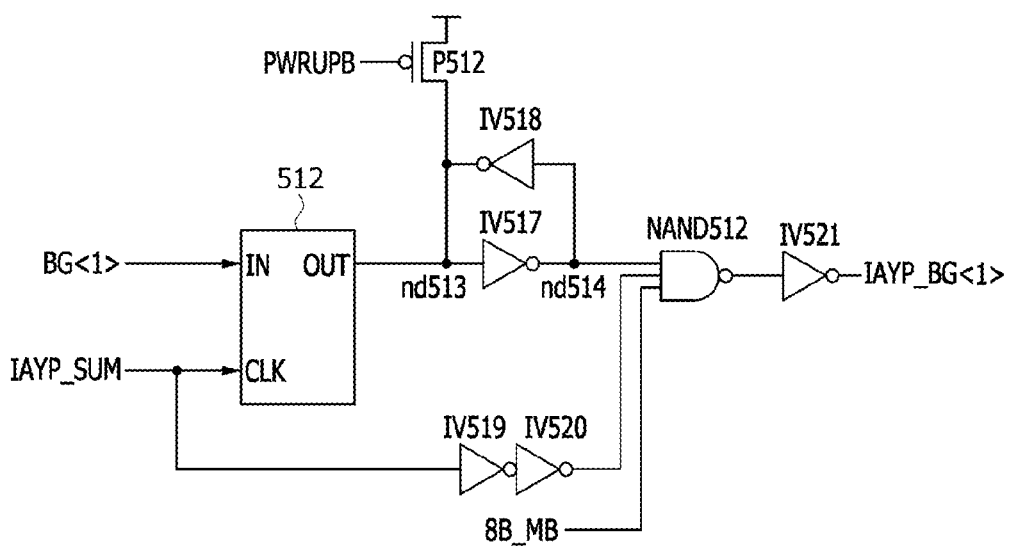

Referring to FIG. 6, the first column operation control circuit 51 may include: a first bank selection signal latch 511; a second bank selection signal latch 512; inverters IV511, IV512, IV513, IV514, IV515, IV516, IV517, IV518, IV519, IV520, and IV521; PMOS transistors P511 and P512; and NAND gates NAND511 and NAND 512. The first bank selection signal latch 511 may latch the first bank selection signal BG<1> in synchronization with the synthesis control pulse AYP_SUM and output the latched signal to a node nd511. The second bank selection signal latch 512 may latch the first bank selection signal BG<1> in synchronization with the internal synthesis control pulse IAYP_SUM and output the latched signal to a node nd513. The PMOS transistor P511 may initialize the node nd511 to a logic "high" level while a power-up signal PWRUPB is enabled to have a logic "low" level. The PMOS transistor P512 may initialize the node nd513 to a logic "high" level while the power-up signal PWRUPB is enabled to have a logic "low" level. The inverter IV511 may inversely buffer a signal of the node nd511 and output the inversely buffered signal to a node nd512. The inverter IV512 may inversely buffer a signal of the node nd512 and output the inversely buffered signal to the node nd511. The inverters IV513 and IV514, which are sequentially connected in series, may buffer the synthesis control pulse AYP_SUM and output the buffered pulse. The NAND gate NAND511 may perform a logical NAND operation of a signal of the node nd512 and an output signal of the inverter IV514. The inverter IV515 may inversely buffer an output signal of the NAND gate NAND511 and output the inversely buffered signal as the first bank control pulse AYP_BG<1>. The inverter IV516 may inversely buffer an output signal of the NAND gate NAND511 and output the inversely buffered signal as the first bank address control signal CADDL_BG<1>. The inverter IV517 may inversely buffer a signal of the node nd513 and output the inversely buffered signal to a node nd514. The inverter IV518 may inversely buffer a signal of the node nd514 and output the inversely buffered signal to the node nd513. The inverters IV519 and IV520, which are sequentially connected in series, may buffer the internal synthesis control pulse IAYP_SUM and output the buffered pulse. The NAND gate NAND512 may perform a logical NAND operation of a signal of the node nd514, an output signal of the inverter IV520, and the mode signal 8B_MB. The inverter IV521 may inversely buffer an output signal of the NAND gate NAND512 and output the inversely buffered signal as the first internal bank control pulse IAYP_BG<1>.

The first column operation control circuit 51 may receive the mode signal 8B_MB, which is disabled if the semiconductor device 100 is out of the eight-bank mode, and may generate the first internal bank control pulse IAYP_BG<1> from the first bank selection signal BG<1>, which is latched in synchronization with the internal synthesis control pulse IAYP_SUM. The first column operation control circuit 51 may receive the mode signal 8B_MB, which is enabled in the eight-bank mode, and may interrupt the creation of the first internal bank control pulse IAYP_BG<1>.

Figure 7:
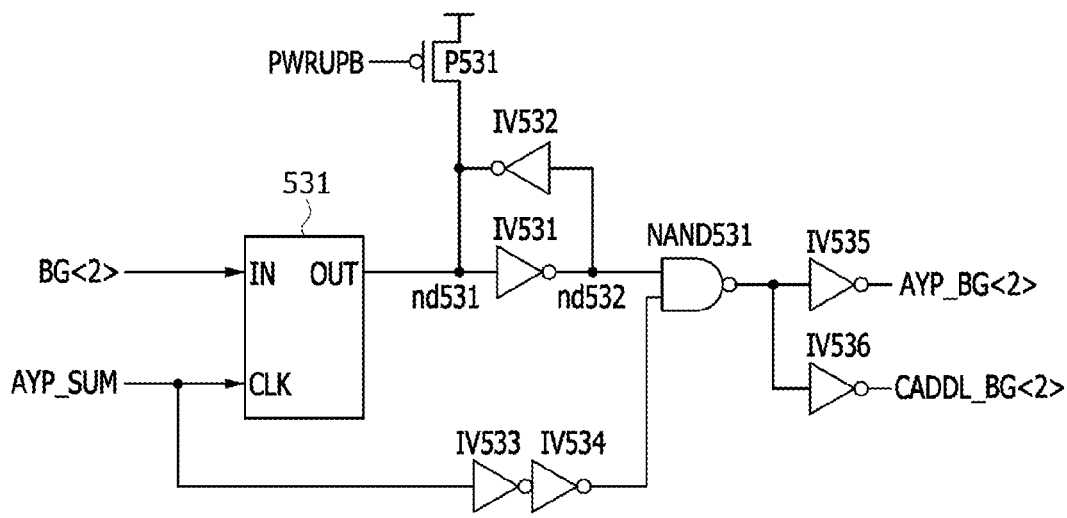
FIG. 7 shows a circuit diagram illustrating the second column operation control circuit included in the column operation control circuit of FIG. 5.
Figure 7:
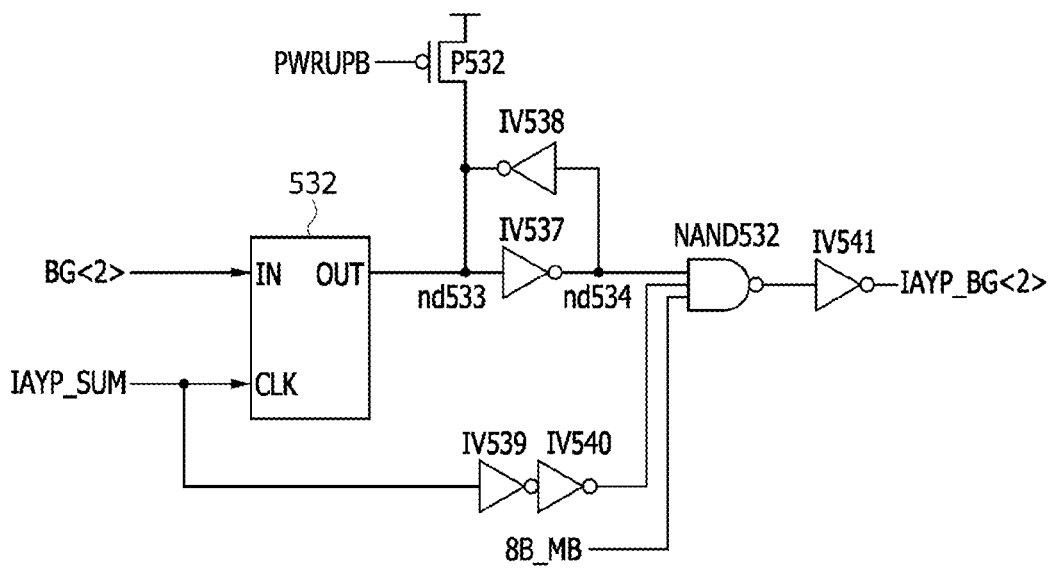

Referring to FIG. 7, the second column operation control circuit 53 may include: a third bank selection signal latch 531; a fourth bank selection signal latch 532; inverters IV531, IV531, IV532, IV533, IV534, IV535, IV536, IV537, IV538, IV539, IV540, and IV541; PMOS transistors P531 and P532; and NAND gates NAND531 and NAND 532. The third bank selection signal latch 531 may latch the second bank selection signal BG<2> in synchronization with the synthesis control pulse AYP_SUM and output the latched signal to a node nd531. The fourth bank selection signal latch 532 may latch the second bank selection signal BG<2> in synchronization with the internal synthesis control pulse IAYP_SUM and output the latched signal to a node nd533.

The PMOS transistor P531 may initialize the node nd531 to a logic "high" level while the power-up signal PWRUPB is enabled to have a logic "low" level. The PMOS transistor P532 may initialize the node nd533 to a logic "high" level while the power-up signal PWRUPB is enabled to have a logic "low" level. The inverter IV531 may inversely buffer a signal of the node nd531 and output the inversely buffered signal to a node nd532. The inverter IV532 may inversely buffer a signal of the node nd532 and output the inversely buffered signal to the node nd531. The inverters IV533 and IV534, which are sequentially connected in series, may buffer the synthesis control pulse AYP_SUM and output the buffered pulse. The NAND gate NAND531 may perform a logical NAND operation of a signal of the node nd532 and an output signal of the inverter IV534. The inverter IV535 may inversely buffer an output signal of the NAND gate NAND531 and output the inversely buffered signal as the second bank control pulse AYP_BG<2>. The inverter IV536 may inversely buffer an output signal of the NAND gate NAND531 and output the inversely buffered signal as the second bank address control signal CADDL_BG<2>. The inverter IV537 may inversely buffer a signal of the node nd533 and output the inversely buffered signal to a node nd534. The inverter IV538 may inversely buffer a signal of the node nd534 and output the inversely buffered signal to the node nd533. The inverters IV539 and IV540, which are sequentially connected in series, may buffer the internal synthesis control pulse IAYP_SUM and output the buffered pulse. The NAND gate NAND532 may perform a logical NAND operation of a signal of the node nd534, an output signal of the inverter IV540, and the mode signal 8B_MB. The inverter IV541 may inversely buffer an output signal of the NAND gate NAND532 and output the inversely buffered signal as the second internal bank control pulse IAYP_BG<2>.

The second column operation control circuit 53 may receive the mode signal 8B_MB, which is disabled if the semiconductor device 100 is out of the eight-bank mode, and may generate the second internal bank control pulse IAYP_BG<2> from the second bank selection signal BG<2>, which is latched in synchronization with the internal synthesis control pulse IAYP_SUM. The second column operation control circuit 53 may receive the mode signal 8B_MB, which is enabled in the eight-bank mode, and may interrupt the creation of the second internal bank control pulse IAYP_BG<2>.

Figure 8:
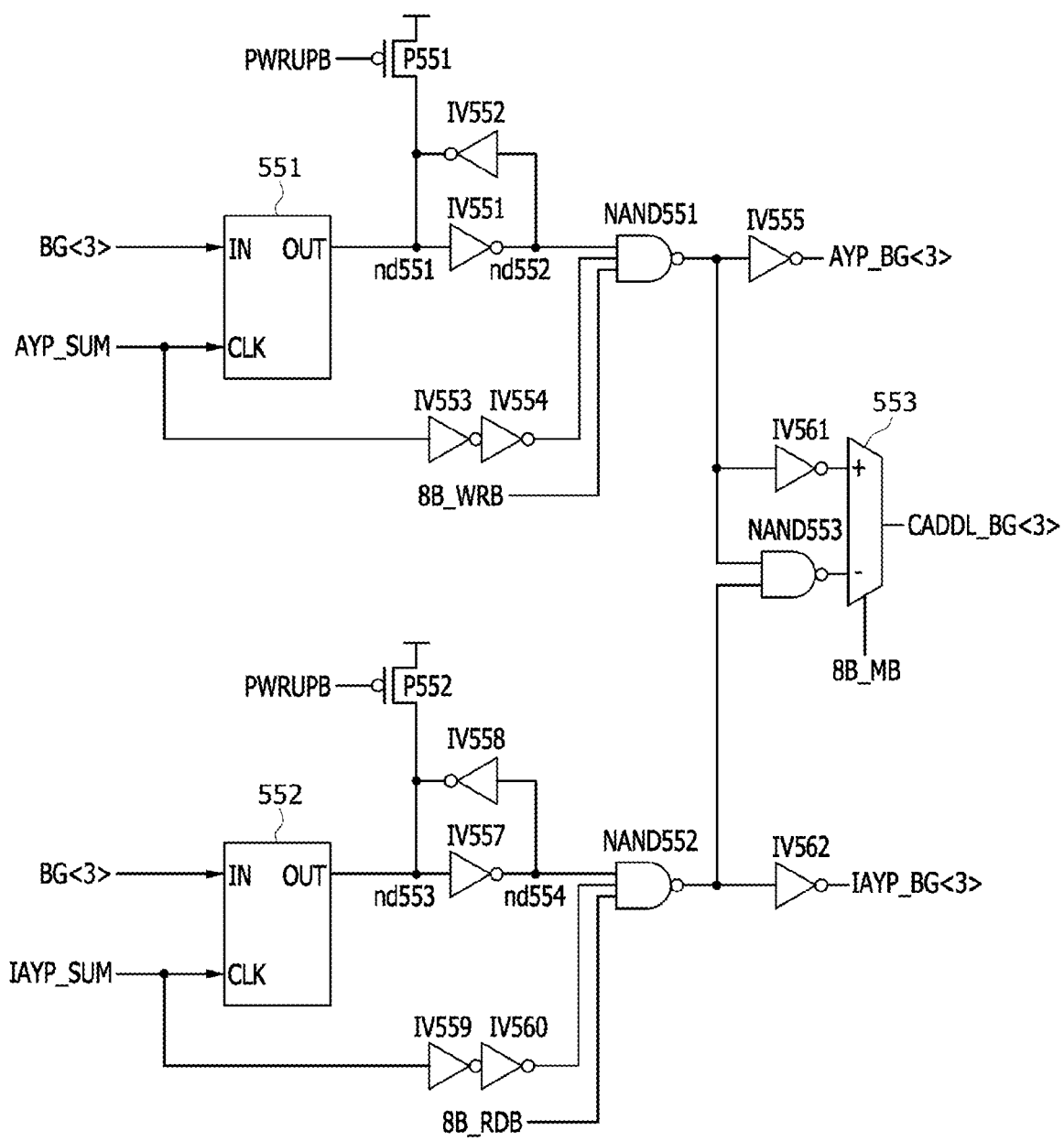
FIG. 8 shows a circuit diagram illustrating the third column operation control circuit included in the column operation control circuit of FIG. 5.

Referring to FIG. 8, the third column operation control circuit 55 may include: a fifth bank selection signal latch 551; a sixth bank selection signal latch 552; inverters IV551, IV552, IV553, IV554, IV555, IV556, IV557, IV558, IV559, IV560, IV561, and IV562; PMOS transistors P551 and P552; NAND gates NAND551, NAND552, and NAND553; and a first selector 553. The fifth bank selection signal latch 551 may latch the third bank selection signal BG<3> in synchronization with the synthesis control pulse AYP_SUM and output the latched signal to a node nd551. The sixth bank selection signal latch 552 may latch the third bank selection signal BG<3> in synchronization with the internal synthesis control pulse IAYP_SUM and output the latched signal to a node nd553. The PMOS transistor P551 may initialize the node nd551 to a logic "high" level while the power-up signal PWRUPB is enabled to have a logic "low" level. The PMOS transistor P552 may initialize the node nd553 to a logic "high" level while the power-up signal PWRUPB is enabled to have a logic "low" level. The inverter IV551 may inversely buffer a signal of the node nd551 and output the inversely buffered signal to a node nd552. The inverter IV552 may inversely buffer a signal of the node nd552 and output the inversely buffered signal to the node nd551. The inverters IV553 and IV554, which are sequentially connected in series, may buffer the synthesis control pulse AYP_SUM and output the buffered pulse. The NAND gate NAND551 may perform a logical NAND operation of a signal of the node nd552, an output signal of the inverter IV554, and the mode write signal 8B_WRB. The inverter IV555 may inversely buffer an output signal of the NAND gate NAND551 and output the inversely buffered signal as the third bank control pulse AYP_BG<3>. The inverter IV557 may inversely buffer a signal of the node nd553 and output the inversely buffered signal to a node nd554. The inverter IV558 may inversely buffer a signal of the node nd554 and output the inversely buffered signal to the node nd553. The inverters IV559 and IV560, which are sequentially connected in series, may buffer the internal synthesis control pulse IAYP_SUM and output the buffered pulse. The NAND gate NAND552 may perform a logical NAND operation of a signal of the node nd554, an output signal of the inverter IV560 and the mode read signal 8B_RDB. The inverter IV561 may inversely buffer an output signal of the NAND gate NAND551 and output the inversely buffered signal. The NAND gate NAND553 may perform a logical NAND operation of an output signal of the NAND gate NAND551 and an output signal of the NAND gate NAND552. The first selector 553 may selectively output an output signal of the inverter IV561 or an output signal of the NAND gate NAND553 as the third bank address control signal CADDL_BG<3> in response to the mode signal 8B_MB. The first selector 553 may receive the mode signal 8B_MB having a logic "high" level and output an output signal of the inverter IV561 as the third bank address control signal CADDL_BG<3> if the semiconductor device 100 is out of the eight-bank mode. The first selector 553 may receive the mode signal 8B_MB having a logic "low" level and output an output signal of the NAND gate NAND553 as the third bank address control signal CADDL_BG<3> in the eight-bank mode. The inverter IV562 may inversely buffer an output signal of the NAND gate NAND552 and output the inversely buffered signal as the third internal bank control pulse IAYP_BG<3>.

The third column operation control circuit 55 may receive the mode write signal 8B_WRB, which is disabled if the semiconductor device 100 is out of the eight-bank write mode, and may generate the third bank control pulse AYP_BG<3> from the third bank selection signal BG<3>, which is latched in synchronization with the synthesis control pulse AYP_SUM. The third column operation control circuit 55 may receive the mode write signal 8B_WRB, which is enabled in the eight-bank write mode, and may interrupt the creation of the third bank control pulse AYP_BG<3>. The third column operation control circuit 55 may receive the mode read signal 8B_RDB, which is disabled if the semiconductor device 100 is out of the eight-bank read mode, and may generate the third internal bank control pulse IAYP_BG<3> from the third bank selection signal BG<3>, which is latched in synchronization with the internal synthesis control pulse IAYP_SUM. The third column operation control circuit 55 may receive the mode read signal 8B_RDB, which is enabled in the eight-bank read mode, and may interrupt the creation of the third internal bank control pulse IAYP_BG<3>. The third column operation control circuit 55 may receive the mode signal 8B_MB, which is disabled if the semiconductor device 100 is out of the eight-bank write mode, and the eight-bank read mode and may generate the third bank address control signal CADDL_BG<3> from the third bank selection signal BG<3>, which is latched in synchronization with the synthesis control pulse AYP_SUM. The third column operation control circuit 55 may receive the mode read signal 8B_RDB, which is enabled in the eight-bank read mode, and may generate the third bank address control signal CADDL_BG<3> from the third bank selection signal BG<3>, which is latched in synchronization with the synthesis control pulse AYP_SUM. The third column operation control circuit 55 may receive the mode write signal 8B_WRB, which is enabled in the eight-bank write mode, and may generate the third bank address control signal CADDL_BG<3> from the third bank selection signal BG<3>, which is latched in synchronization with the internal synthesis control pulse IAYP_SUM.

Figure 9:
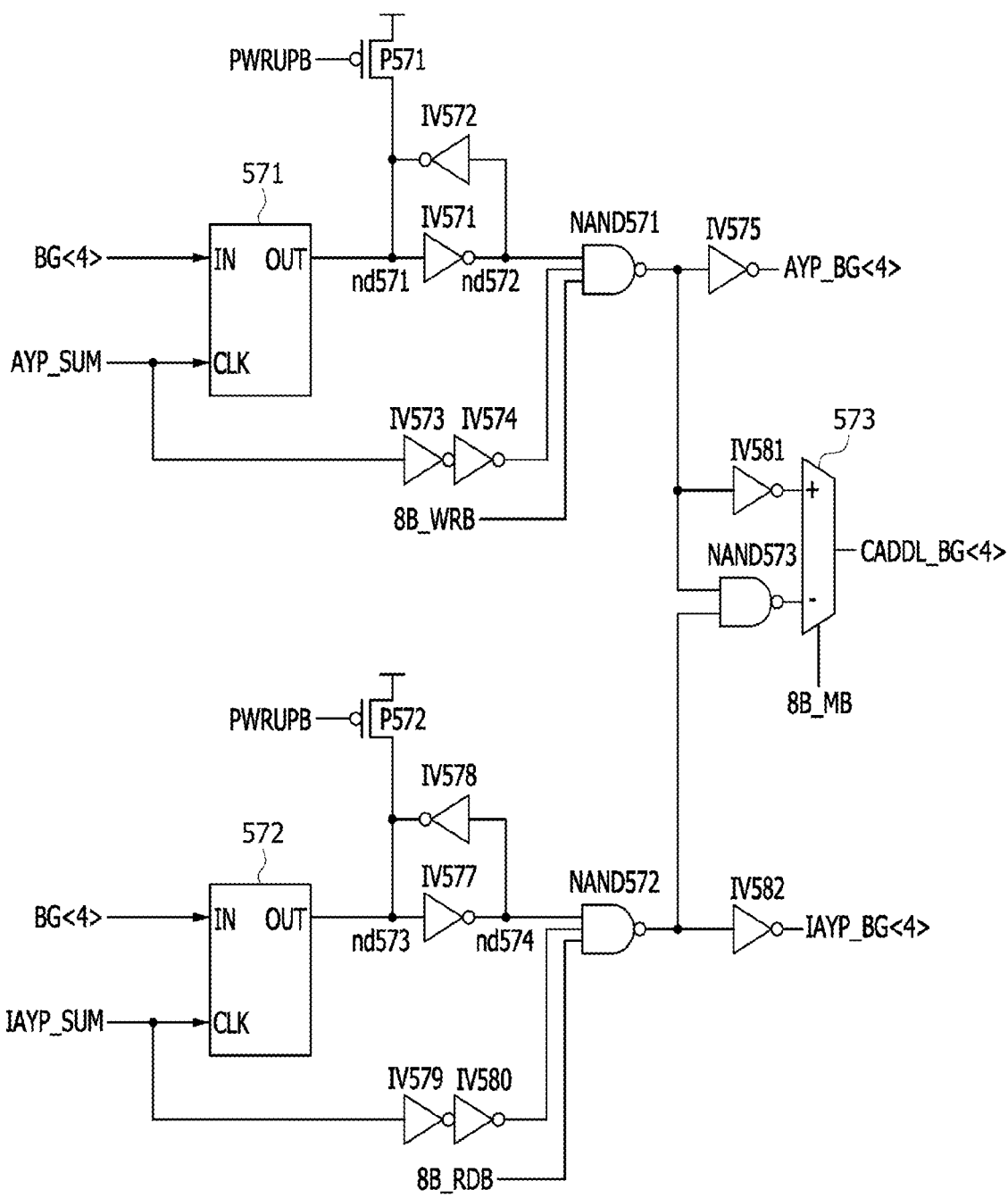
FIG. 9 shows a circuit diagram illustrating the fourth column operation control circuit included in the column operation control circuit of FIG. 5.

Referring to FIG. 9, the fourth column operation control circuit 57 may include: a seventh bank selection signal latch 571; an eighth bank selection signal latch 572; inverters IV571, IV572, IV573, IV574, IV575, IV577, IV578, IV579, IV580, IV581, and IV582; PMOS transistors P571 and P572; NAND gates NAND571, NAND572, and NAND573; and a second selector 573. The seventh bank selection signal latch 571 may latch the fourth bank selection signal BG<4> in synchronization with the synthesis control pulse AYP_SUM and output the latched signal to a node nd571. The eighth bank selection signal latch 572 may latch the fourth bank selection signal BG<4> in synchronization with the internal synthesis control pulse IAYP_SUM and output the latched signal to a node nd573. The PMOS transistor P571 may initialize the node nd571 to a logic "high" level while the power-up signal PWRUPB is enabled to have a logic "low" level. The PMOS transistor P572 may initialize the node nd573 to a logic "high" level while the power-up signal PWRUPB is enabled to have a logic "low" level. The inverter IV571 may inversely buffer a signal of the node nd571 and output the inversely buffered signal to a node nd572. The inverter IV572 may inversely buffer a signal of the node nd572 and output the inversely buffered signal to the node nd571. The inverters IV573 and IV574, which are sequentially connected in series, may buffer the synthesis control pulse AYP_SUM and output the buffered pulse. The NAND gate NAND571 may perform a logical NAND operation of a signal of the node nd572, an output signal of the inverter IV574, and the mode write signal 8B_WRB. The inverter IV575 may inversely buffer an output signal of the NAND gate NAND571 and output the inversely buffered signal as the fourth bank control pulse AYP_BG<4>. The inverter IV577 may inversely buffer a signal of the node nd573 and output the inversely buffered signal to a node nd574. The inverter IV578 may inversely buffer a signal of the node nd574 and output the inversely buffered signal to the node nd573. The inverters IV579 and IV580, which are sequentially connected in series, may buffer the internal synthesis control pulse IAYP_SUM and output the buffered pulse. The NAND gate NAND572 may perform a logical NAND operation of a signal of the node nd574, an output signal of the inverter IV580, and the mode read signal 8B_RDB. The inverter IV581 may inversely buffer an output signal of the NAND gate NAND571 and output the inversely buffered signal. The NAND gate NAND573 may perform a logical NAND operation of an output signal of the NAND gate NAND571 and an output signal of the NAND gate NAND572. The second selector 573 may selectively output an output signal of the inverter IV581 or an output signal of the NAND gate NAND573 as the fourth bank address control signal CADDL_BG<4> in response to the mode signal 8B_MB. The second selector 573 may receive the mode signal 8B_MB having a logic "high" level and output an output signal of the inverter IV581 as the fourth bank address control signal CADDL_BG<4> if the semiconductor device 100 is out of the eight-bank mode. The second selector 573 may receive the mode signal 8B_MB having a logic "low" level and output an output signal of the NAND gate NAND573 as the fourth bank address control signal CADDL_BG<4> in the eight-bank mode. The inverter IV582 may inversely buffer an output signal of the NAND gate NAND572 and output the inversely buffered signal as the fourth internal bank control pulse IAYP_BG<4>.

The fourth column operation control circuit 57 may receive the mode write signal 8B_WRB, which is disabled if the semiconductor device 100 is out of the eight-bank write mode, and may generate the fourth bank control pulse AYP_BG<4> from the fourth bank selection signal BG<4>, which is latched in synchronization with the synthesis control pulse AYP_SUM. The fourth column operation control circuit 57 may receive the mode write signal 8B_WRB, which is enabled in the eight-bank write mode, and may interrupt the creation of the fourth bank control pulse AYP_BG<4>. The fourth column operation control circuit 57 may receive the mode read signal 8B_RDB, which is disabled if the semiconductor device 100 is out of the eight-bank read mode, and may generate the fourth internal bank control pulse IAYP_BG<4> from the fourth bank selection signal BG<4>, which is latched in synchronization with the internal synthesis control pulse IAYP_SUM. The fourth column operation control circuit 57 may receive the mode read signal 8B_RDB, which is enabled in the eight-bank read mode, and may interrupt the creation of the fourth internal bank control pulse IAYP_BG<4>. The fourth column operation control circuit 57 may receive the mode signal 8B_MB, which is disabled if the semiconductor device 100 is out of the eight-bank write mode and the eight-bank read mode, and may generate the fourth bank address control signal CADDL_BG<4> from the fourth bank selection signal BG<4>, which is latched in synchronization with the synthesis control pulse AYP_SUM. The fourth column operation control circuit 57 may receive the mode read signal 8B_RDB, which is enabled in the eight-bank read mode, and may generate the fourth bank address control signal CADDL_BG<4> from the fourth bank selection signal BG<4>, which is latched in synchronization with the synthesis control pulse AYP_SUM. The fourth column operation control circuit 57 may receive the mode write signal 8B_WRB, which is enabled in the eight-bank write mode, and may generate the fourth bank address control signal CADDL_BG<4> from the fourth bank selection signal BG<4>, which is latched in synchronization with the internal synthesis control pulse IAYP_SUM.

Figure 10:
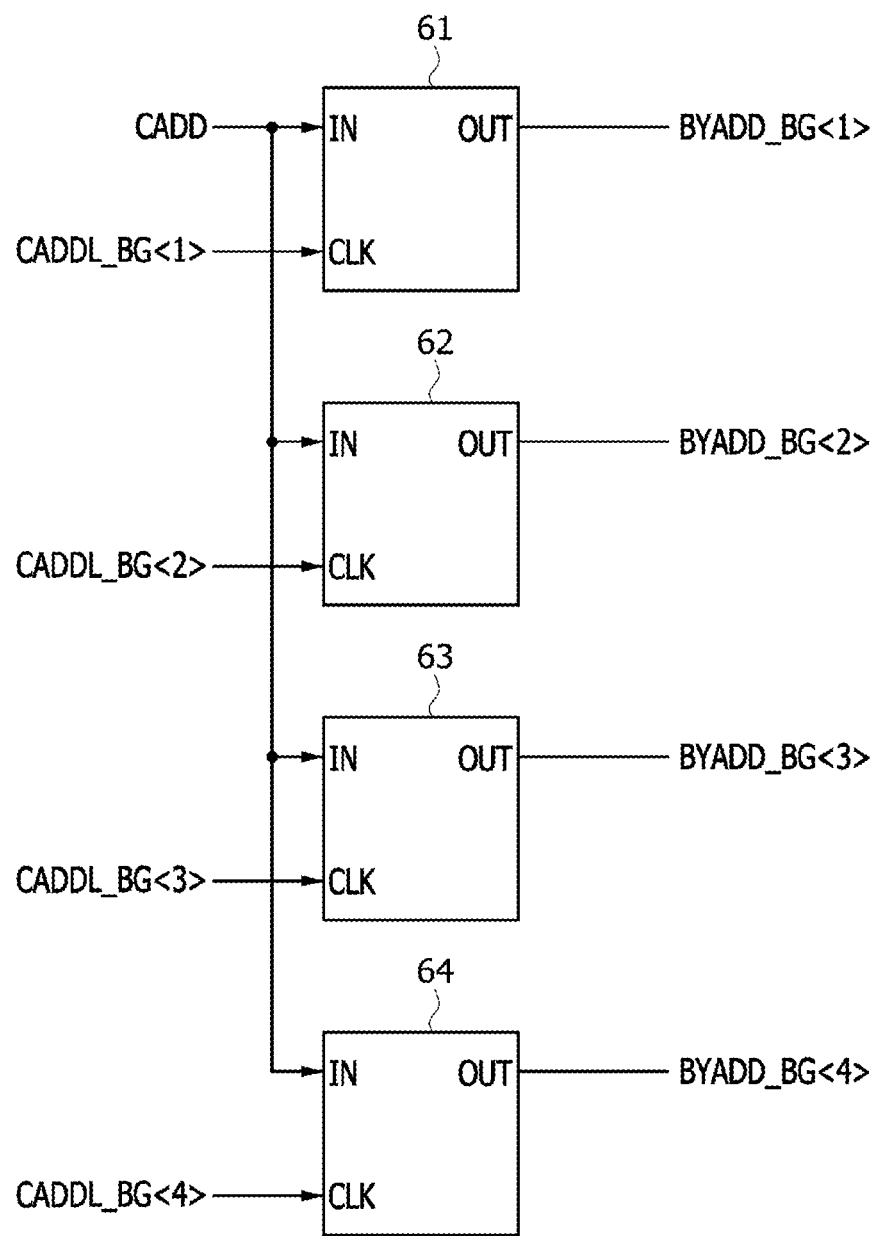
FIG. 10 shows a block diagram illustrating a configuration of the bank column address generation circuit included in the semiconductor device of FIG. 1.

Referring to FIG. 10, the bank column address generation circuit 6 may include a first address latch 61, a second address latch 62, a third address latch 63, and a fourth address latch 64. The first address latch 61 may latch the column address CADD and output the latched address as the first bank column address BYADD_BG<1> if the first bank address control signal CADDL_BG<1> is enabled to have a logic "high" level. The second address latch 62 may latch the column address CADD and output the latched address as the second bank column address BYADD_BG<2> if the second bank address control signal CADDL_BG<2> is enabled to have a logic "high" level. The third address latch 63 may latch the column address CADD and output the latched address as the third bank column address BYADD_BG<3> if the third bank address control signal CADDL_BG<3> is enabled to have a logic "high" level. The fourth address latch 64 may latch the column address CADD and output the latched address as the fourth bank column address BYADD_BG<4> if the fourth bank address control signal CADDL_BG<4> is enabled to have a logic "high" level.

Figure 11:
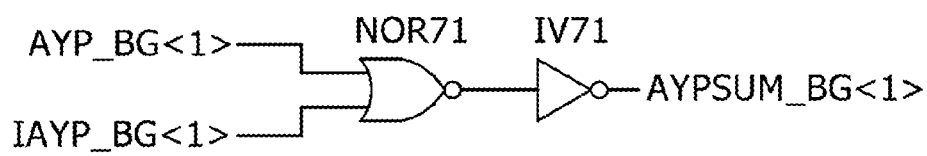
FIG. 11 shows a circuit diagram illustrating the column input/output (I/O) pulse synthesis circuit included in the semiconductor device of FIG. 1.
Figure 11:
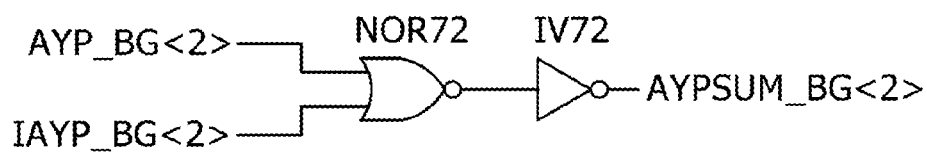
Figure 11:
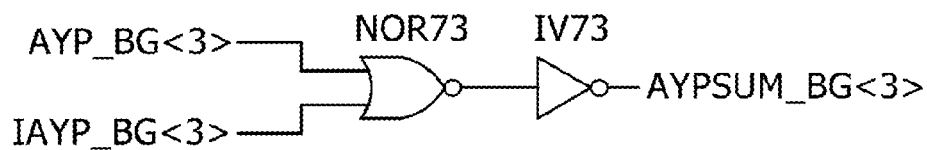
Figure 11:
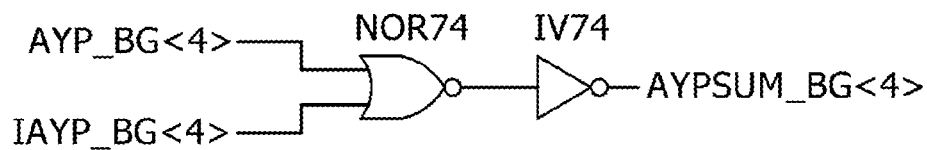

Referring to FIG. 11, the column I/O pulse synthesis circuit 7 may include NOR gates NOR71, NOR72, NOR73, and NOR74 and inverters IV71, IV72, IV73, and IV74. The NOR gate NOR71 and the inverter IV71 may together perform a logical OR operation of the first bank control pulse AYP_BG<1> and the first internal bank control pulse IAYP_BG<1> to generate the first bank synthesis control pulse AYPSUM_BG<1>. The NOR gate NOR72 and the inverter IV72 may together perform a logical OR operation of the second bank control pulse AYP_BG<2> and the second internal bank control pulse IAYP_BG<2> to generate the second bank synthesis control pulse AYPSUM_BG<2>. The NOR gate NOR73 and the inverter IV73 may together perform a logical OR operation of the third bank control pulse AYP_BG<3> and the third internal bank control pulse IAYP_BG<3> to generate the third bank synthesis control pulse AYPSUM_BG<3>. The NOR gate NOR74 and the inverter IV74 may together perform a logical OR operation of the fourth bank control pulse AYP_BG<4> and the fourth internal bank control pulse IAYP_BG<4> to generate the fourth bank synthesis control pulse AYPSUM_BG<4>. The column I/O pulse synthesis circuit 7 may generate the first bank synthesis control pulse AYPSUM_BG<1> if the first bank control pulse AYP_BG<1> or the first internal bank control pulse IAYP_BG<1> is created. The column I/O pulse synthesis circuit 7 may generate the second bank synthesis control pulse AYPSUM_BG<2> if the second bank control pulse AYP_BG<2> or the second internal bank control pulse IAYP_BG<2> is created. The column I/O pulse synthesis circuit 7 may generate the third bank synthesis control pulse AYPSUM_BG<3> if the third bank control pulse AYP_BG<3> or the third internal bank control pulse IAYP_BG<3> is created. The column I/O pulse synthesis circuit 7 may generate the fourth bank synthesis control pulse AYPSUM_BG<4> if the fourth bank control pulse AYP_BG<4> or the fourth internal bank control pulse IAYP_BG<4> is created.

Operations of the semiconductor device 100 having the aforementioned configuration are described hereinafter with reference to FIGS. 12 and 13 in conjunction with an example in which the semiconductor device 100 is in the eight-bank read mode and an example in which the semiconductor device 100 is in the eight-bank write mode.

Figure 12:
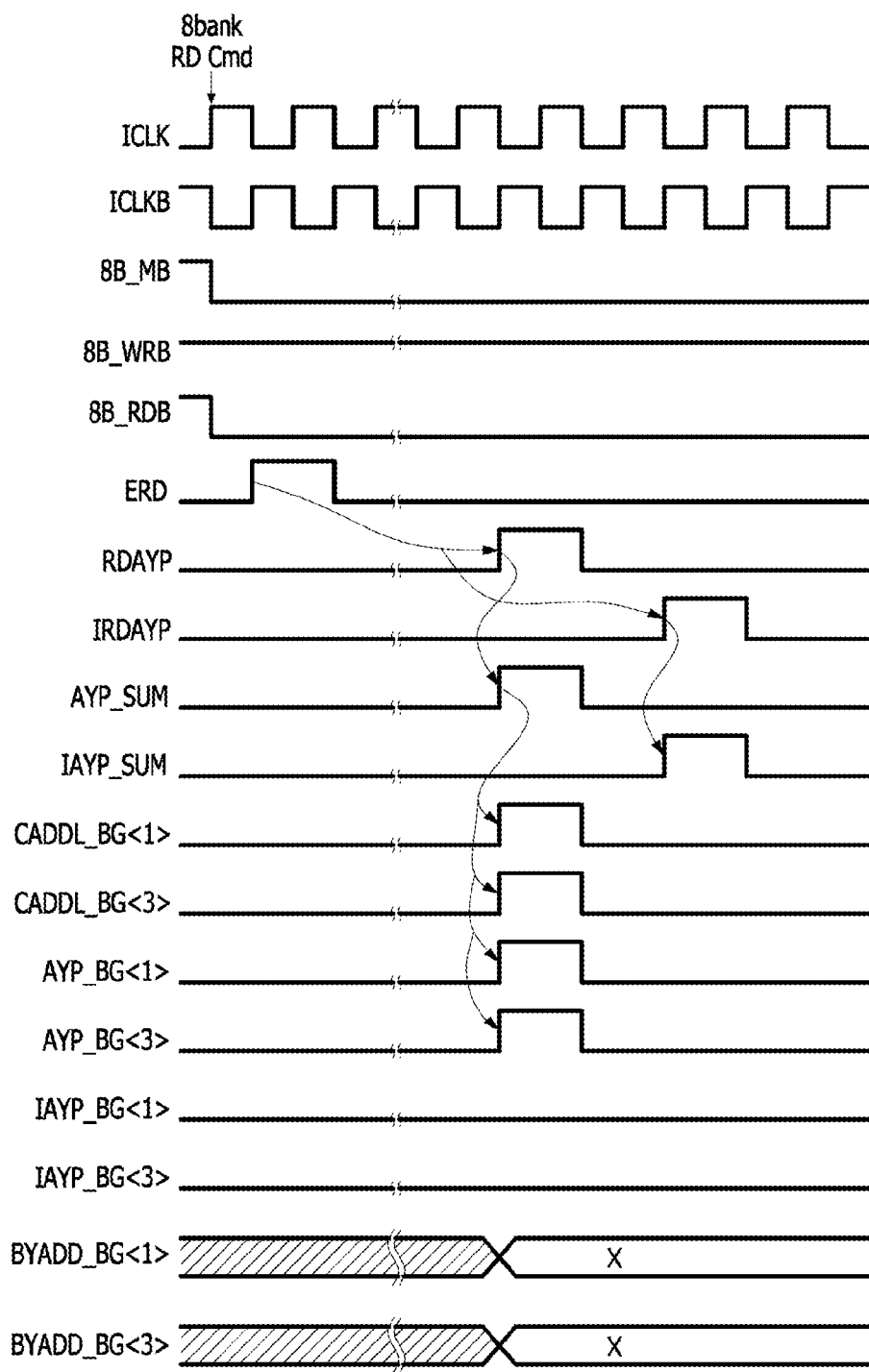
FIGS. 12 and 13 show timing diagrams illustrating operations of the semiconductor device of FIG. 1.

As illustrated in FIG. 12, if an eight-bank read command 8bank_RD_Cmd is inputted to the semiconductor device 100 to put the semiconductor device 100 in the eight-bank read mode, then the mode signal 8B_MB and the mode read signal 8B_RDB may be enabled to have a logic "low" level, and the read command pulse ERD may be created. The read command pulse ERD may be shifted to sequentially generate the read column control pulse RDAYP and the internal read column control pulse IRDAYP. The synthesis control pulse AYP_SUM and the internal synthesis control pulse IAYP_SUM may be sequentially generated in synchronization with the read column control pulse RDAYP and the internal read column control pulse IRDAYP, respectively. The first bank address control signal CADDL_BG<1>, the third bank address control signal CADDL_BG<3>, the first bank control pulse AYP_BG<1>, and the third bank control pulse AYP_BG<3> may be generated in synchronization with the synthesis control pulse AYP_SUM. A bank included in the first bank group may be selected by a logic level combination 'X' of the first bank column address BYADD_BG<1>, which is generated by latching the column address CADD in synchronization with the first bank address control signal CADDL_BG<1>, and data having the predetermined number of bits may be outputted from the selected bank by the first bank synthesis control pulse AYPSUM_BG<1>, which is generated in synchronization with the first bank control pulse AYP_BG<1>. For example, if the burst length is set to be 'BL32,' then sixteen-bit data may be outputted from the bank included in the first bank group. A bank included in the third bank group may be selected by a logic level combination 'X' of the third bank column address BYADD_BG<3>, which is generated by latching the column address CADD in synchronization with the third bank address control signal CADDL_BG<3>, and data having the predetermined number of bits may be outputted from the selected bank by the third bank synthesis control pulse AYPSUM_BG<3>, which is generated in synchronization with the third bank control pulse AYP_BG<3>. For example, if the burst length is set to be 'BL32,' then sixteen-bit data may be outputted from the bank included in the third bank group. In the eight-bank read mode, the data of the bank included in the first bank group and the data of the bank included in the third bank group may be simultaneously loaded on a data line, and the data loaded on the data line may be outputted from the semiconductor device 100 through data paths after an output sequence of the data is determined according to the burst length. Although the present embodiment describes the eight-bank read mode in which the sixteen-bit data of the bank included in the first bank group and the sixteen-bit data of the bank included in the third bank group are outputted, the present disclosure is not limited thereto. For example, the number of the bank groups and the number of bits included in the data may be different in different embodiments.

The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals overlap each other such that there exists at least one time at which the first and second occurrences are both taking place.

Figure 13:
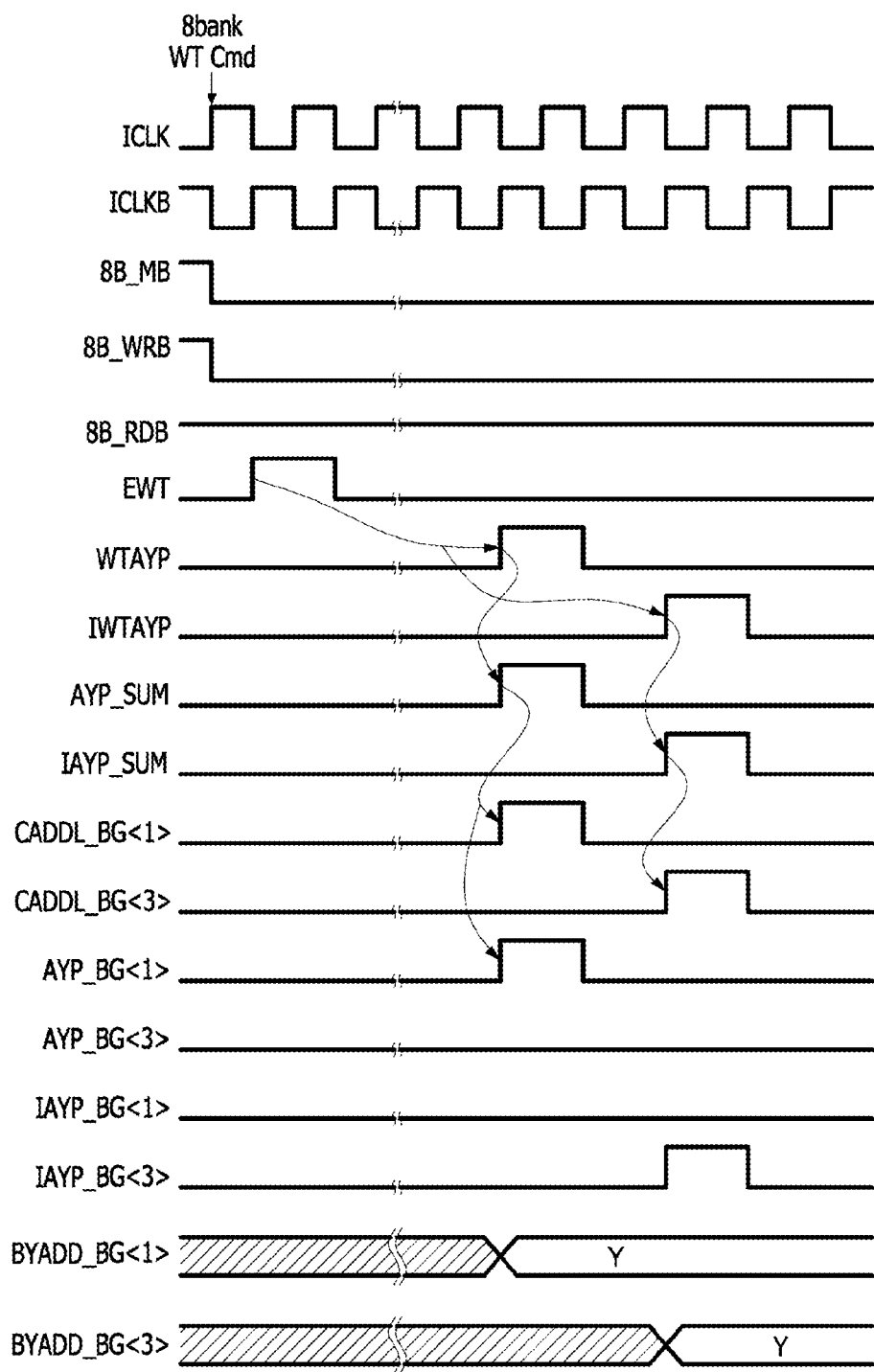

As illustrated in FIG. 13, if an eight-bank write command 8bank_WT_Cmd is inputted to the semiconductor device 100 to put the semiconductor device 100 in the eight-bank write mode, then the mode signal 8B_MB and the mode write signal 8B_WRB may be enabled to have a logic "low" level, and the write command pulse EWT may be created. The write command pulse EWT may be shifted to sequentially generate the write column control pulse WTAYP and the internal write column control pulse IWTAYP. The synthesis control pulse AYP_SUM and the internal synthesis control pulse IAYP_SUM may be sequentially generated in synchronization with the write column control pulse WTAYP and the internal write column control pulse IWTAYP, respectively. The first bank address control signal CADDL_BG<1> and the first bank control pulse AYP_BG<1> may be generated in synchronization with the synthesis control pulse AYP_SUM. The third bank address control signal CADDL_BG<3> and the third internal bank control pulse IAYP_BG<3> may be generated in synchronization with the internal synthesis control pulse IAYP_SUM. A bank included in the first bank group may be selected by a logic level combination 'Y' of the first bank column address BYADD_BG<1>, which is generated by latching the column address CADD in synchronization with the first bank address control signal CADDL_BG<1>, and data having the predetermined number of bits may be inputted into the selected bank by the first bank synthesis control pulse AYPSUM_BG<1>, which is generated in synchronization with the first bank control pulse AYP_BG<1>. For example, if the burst length is set to be 'BL32,' then sixteen-bit data may be inputted into the bank included in the first bank group. A bank included in the third bank group may be selected by a logic level combination 'Y' of the third bank column address BYADD_BG<3>, which is generated by latching the column address CADD in synchronization with the third bank address control signal CADDL_BG<3>, and data having the predetermined number of bits may be inputted into the selected bank by the third bank synthesis control pulse AYPSUM_BG<3>, which is generated in synchronization with the third internal bank control pulse IAYP_BG<3>. For example, if the burst length is set to be 'BL32,' sixteen-bit data may be inputted into the bank included in the third bank group. In the eight-bank write mode, the sixteen-bit data may be inputted into the bank included in the first bank group, and the sixteen-bit data may then be inputted into the bank included in the third bank group. Although the present embodiment describes the eight-bank write mode in which the sixteen-bit data are inputted into the bank included in the first bank group and the sixteen-bit data are then inputted into the bank included in the third bank group, the present disclosure is not limited thereto. For example, the number of the bank groups and the number of bits included in the data may be different in embodiments.

As described above, a semiconductor device 100 according to an embodiment of the present teachings may simultaneously output data stored in separate bank groups to data paths and may then sequentially output the data loaded on the data paths to an external device according to a burst length, in an eight-bank read mode. In addition, the semiconductor device 100 may sequentially store data into banks included in separate bank groups, in an eight-bank write mode. If a command is inputted to the semiconductor device 100 to put the semiconductor device 100 in the eight-bank read mode or the eight-bank write mode, then data stored in banks included in a plurality of bank groups may be outputted or data may be inputted into the banks included in the plurality of bank groups. As a result, it may be possible to reduce the time and energy consumed in a column operation for outputting or receiving the data.

According to the embodiment described above, if a command is inputted to a semiconductor device 100 once, column operations of a plurality of banks may be performed together to reduce the time it takes to perform the column operations as well as the energy consumed during the column operations.

Figure 14:
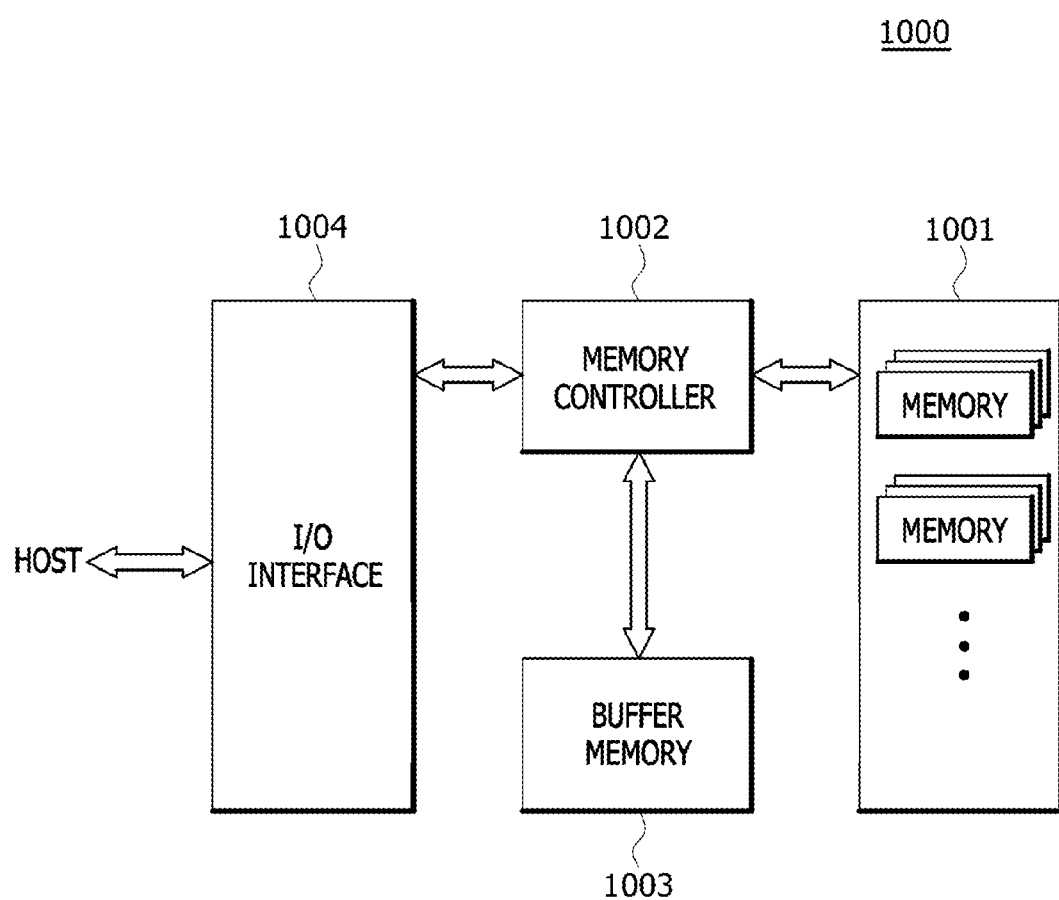
FIG. 14 shows a block diagram illustrating a configuration of an electronic system employing the semiconductor device shown in FIG. 1.

The semiconductor device 100 described with reference to FIGS. 1 to 13 may be integrated into an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 100 illustrated in FIG. 1. The data storage circuit 1001 may include nonvolatile memory that can retain its stored data even when its power supply is interrupted. The nonvolatile memory may be a flash memory, such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 and another controller for controlling the buffer memory 1003, of the buffer memory being volatile memory.

The buffer memory 1003 may temporarily store data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory, such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols, such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor device comprising:
a column operation control circuit configured to generate first and second bank address control signals as well as first and second bank control pulses from first and second bank selection signals in response to a synthesis control pulse such that data in a first bank and data in a second bank are simultaneously outputted in a first mode; and a bank column address generation circuit configured to generate first and second bank column addresses for selecting the first and second banks from a column address in response to the first and second bank address control signals.

2. The semiconductor device of claim 1, wherein, in the first mode, data having a number of bits determined according to a burst length are outputted from at least two banks by one command.

3. The semiconductor device of claim 1, wherein the synthesis control pulse is generated in synchronization with a read command pulse to activate the first mode, wherein the read command pulse is created by decoding an external control signal.

4. The semiconductor device of claim 1, wherein the column operation control circuit is further configured to:
latch the first bank selection signal in synchronization with the synthesis control pulse;
generate the first bank address control signal and the first bank control pulse from the latched first bank selection signal;
latch the second bank selection signal in synchronization with the synthesis control pulse; and
generate the second bank address control signal and the second bank control pulse from the latched second bank selection signal.

5. The semiconductor device of claim 1, further comprising a column input and output (I/O) pulse synthesis circuit configured to generate first and second bank synthesis control pulses, in response to the first and second bank control pulses, for controlling column operations for outputting the data in the first and second banks.

6. The semiconductor device of claim 1, wherein the column operation control circuit is configured to:
generate the first bank address control signal and the first bank control pulse from the first bank selection signal in response to the synthesis control pulse such that data are inputted into the second bank after data are inputted into the first bank in a second mode; and
generate the second bank address control signal and an internal bank control pulse from the second bank selection signal in response to an internal synthesis control pulse.

7. The semiconductor device of claim 6, wherein, in the second mode, data having a number of bits determined according to a burst length are inputted into at least two banks by one command.

8. The semiconductor device of claim 6, wherein the synthesis control pulse is generated in synchronization with a write command pulse to activate the second mode, wherein the write command pulse is created by decoding an external control signal, to activate the second mode.

9. The semiconductor device of claim 6, wherein the internal synthesis control pulse is generated after a predetermined period of time elapses from when the synthesis control pulse is created.

10. The semiconductor device of claim 6, wherein, in the second mode, the column operation control circuit is further configured to:
latch the first bank selection signal in synchronization with the synthesis control pulse;
generate the first bank address control signal and the first bank control pulse from the latched first bank selection signal;
latch the second bank selection signal in synchronization with the internal synthesis control pulse; and
generate the second bank address control signal and the internal bank control pulse from the latched second bank selection signal.

11. The semiconductor device of claim 6, further comprising a column input and output I/O pulse synthesis circuit configured to:
generate a first bank synthesis control pulse, in response to the first bank control pulse, for controlling a column operation for inputting data into the first bank; and
generate a second bank synthesis control pulse, in response to the internal bank control pulse, for controlling a column operation for inputting data into the second bank.

12. A semiconductor device comprising:
a synthesis control pulse generation circuit configured to at least one of:
generate a synthesis control pulse in synchronization with a read command pulse, wherein the read command pulse is created by decoding an external control signal to activate a first mode; and
generate the synthesis control pulse and an internal synthesis control pulse in synchronization with a write command pulse, wherein the write command pulse is created by decoding the external control signal to activate a second mode; and
a column operation control circuit configured to generate first and second bank address control signals as well as first and second bank control pulses from first and second bank selection signals in response to the synthesis control pulse such that data in a first bank and data in a second bank are simultaneously outputted in the first mode.

13. The semiconductor device of claim 12, wherein the column operation control circuit is configured to:
latch the first bank selection signal in synchronization with the synthesis control pulse;
generate the first bank address control signal and the first bank control pulse from the latched first bank selection signal;
latch the second bank selection signal in synchronization with the synthesis control pulse; and
generate the second bank address control signal and the second bank control pulse from the latched second bank selection signal.

14. The semiconductor device of claim 12, wherein the column operation control circuit is configured to:
generate the first bank address control signal and the first bank control pulse from the first bank selection signal in response to the synthesis control pulse such that data are inputted into the second bank after data are inputted into the first bank in the second mode; and
generate the second bank address control signal and an internal bank control pulse from the second bank selection signal in response to an internal synthesis control pulse.

15. The semiconductor device of claim 14, wherein, in the second mode, the column operation control circuit is configured to:
latch the first bank selection signal in synchronization with the synthesis control pulse;
generate the first bank address control signal and the first bank control pulse from the latched first bank selection signal;
latch the second bank selection signal in synchronization with the internal synthesis control pulse; and generate the second bank address control signal and the internal bank control pulse from the latched second bank selection signal.

* * * * *